United States Patent [19]
Nishio et al.

[11] Patent Number: 5,683,921
[45] Date of Patent: Nov. 4, 1997

[54] SEMICONDUCTOR DEVICE AND METHOD OF MANUFACTURING THE SAME

[75] Inventors: Mikio Nishio; Susumu Akamatsu; Yasusi Okuda, all of Osaka, Japan

[73] Assignee: Matsushita Electric Industrial Co., Ltd., Osaka, Japan

[21] Appl. No.: 393,673

[22] Filed: Feb. 24, 1995

[30] Foreign Application Priority Data

Feb. 25, 1994 [JP] Japan ................... 6-027941

[51] Int. Cl.⁶ .................................. H01L 21/265
[52] U.S. Cl. .................. 437/35; 437/44; 437/61; 437/50
[58] Field of Search ............... 437/35, 44, 69, 437/61, 41, 50

[56] References Cited

U.S. PATENT DOCUMENTS

| | | |
|---|---|---|
| 4,862,232 | 8/1989 | Lee . |
| 5,439,839 | 8/1995 | Jang ................. 437/44 |
| 5,480,819 | 1/1996 | Huang ............... 437/43 |
| 5,494,838 | 2/1996 | Chang et al. ....... 437/43 |

FOREIGN PATENT DOCUMENTS

| | | |
|---|---|---|
| 0 236 123 | 9/1987 | European Pat. Off. . |
| 59-231868 | 12/1984 | Japan . |
| 60-183773 | 9/1985 | Japan . |
| 61-141180 | 6/1986 | Japan . |
| 62-241376 | 10/1987 | Japan . |
| 3-78260 | 4/1991 | Japan . |
| 3227065 | 10/1991 | Japan . |
| 4051528 | 2/1992 | Japan . |
| 5-326551 | 12/1993 | Japan . |

OTHER PUBLICATIONS

"IBM Technical Disclosure Bulletin", vol. 24, No. 1A, Jun. 1981, New York, pp. 57–60.

C.K. Lau et al. "A Super Self–Aligned Source/Drain Mosfet", 1987 International Electron Devices Meeting, IEDM, Technical Digest (Cat. No. 87CH2515–5), Washington, D.C., 6–9 Dec., 1987, pp. 358–361.

*Primary Examiner*—John Niebling
*Assistant Examiner*—Richard A. Booth
*Attorney, Agent, or Firm*—McDermott, Will & Emery

[57] ABSTRACT

A MOS transistor consists of a gate insulating film, a gate electrode, a pair of sidewall spacers on the side faces of the gate electrode, lightly doped source/drain regions, and heavily doped source/drain regions, which are located below the sidewall spacers. Between the sidewall spacers and an isolation are formed concave portions. On a silicon substrate in the concave portions are formed insulating films for capacitance reduction. On the insulating films for capacitance reduction are formed withdrawn electrodes. The heavily doped source/drain regions are electrically connected to the withdrawn electrodes between the sidewall spacers and the insulating films for capacitance reduction. Consequently, a pn junction capacitance beneath the source/drain regions is reduced, while the contact area between the source/drain regions and wiring is surely obtained, thereby achieving higher integration of the MOS transistors.

4 Claims, 11 Drawing Sheets

PROIR ART

SEMICONDUCTOR DEVICE AND METHOD OF MANUFACTURING THE SAME

BACKGROUND OF THE INVENTION

The present invention relates to a semiconductor device in which a MISFET is disposed and to a method of manufacturing the same. In particular, it relates to a method of reducing a pn junction capacitance.

In recent years, as higher integration and higher-speed operation of semiconductor devices has been achieved, further miniaturization has been required of semiconductor elements such as a MISFET. To meet the requirement, the development of miniaturization techniques has also been pursued. In a semiconductor device in which the MISFET is disposed, the near-surface region of a semiconductor substrate is generally divided into a large number of active regions by an isolation region. On each of the active regions, a gate electrode is formed in the vicinity of the center thereof. Then, an n-type impurity or a p-type impurity is introduced by ion implantation into the regions on both sides of the gate electrode in the active region to form a source/drain region, thus forming the MISFET.

FIG. 10 is a cross-sectional view showing the structure of a semiconductor device in which an n-channel MOS transistor with the so-called LDD structure is disposed as a kind of MISFET. As shown in the drawing, an isolation 2 made of a LOCOS film or the like is formed in the near-surface region of a p-type silicon substrate 1 as a semiconductor substrate. In an active region surrounded by the isolation 2 is disposed a MOS transistor, which consists of: a gate-oxide film 3 composed of a silicon dioxide film, which is formed on the silicon substrate 1; a gate electrode 5 composed of a polysilicon film, which is formed on the gate-oxide film 3; sidewall spacers 6 composed of a silicon dioxide film, which are formed on the side faces of the gate electrode 5; lightly doped source/drain regions 4 formed by doping those regions of the silicon substrate i located below the respective sidewall spacers 6 with an n-type impurity at a low concentration; and heavily doped source drain regions 7 formed by doping those regions of the silicon substrate 1 located between the lightly doped source/drain regions 4 and the isolation 2 with an n-type impurity at a high concentration. In that region of the silicon substrate 1 located between the lightly doped source/drain regions 4, i.e., that region located below the gate electrode 5, is formed a channel region 8 into which an impurity for controlling the threshold voltage has been introduced.

In the process of manufacturing the semiconductor device, after forming the gate electrode 5, ion implantation of an impurity at a low concentration is performed using only the gate electrode 5 as a mask, thereby forming the lightly doped source/drain regions 4. Thereafter, the sidewall spacers 6 are formed on the side faces of the gate electrode 5 and then ion implantation of an impurity at a high concentration is performed using the gate electrode 5 and the sidewall spacers 6 as a mask, thereby forming the heavily doped source/drain regions 7. In a MOS transistor without the LDD structure, however, thick sidewall spacers are not required. Instead, it is sufficient to form an insulating film which can only electrically disconnect source/drain electrodes formed later on the source/drain regions and the gate electrode.

The MOS transistor with such a LDD structure is suitable for implementing higher density, since it can sustain excellent voltage resistance and reliability even when the gate length is reduced. Although FIG. 10 shows the structure of the n-channel MOS transistor, if a p-channel MOS transistor is formed instead, the same basic structure as shown in FIG. 10 is adopted, provided that an impurity of opposite conductivity type is introduced into the source/drain regions or the like.

However, the semiconductor device in which the MOS transistor with the foregoing structure as shown in FIG. 10 is disposed has the following drawbacks.

Between the heavily doped source/drain regions 7 into which an n-type impurity has been introduced and the underlying p-type silicon substrate 1 are formed pn junctions. The pn junctions are formed in wide regions corresponding to the heavily doped source/drain regions 7, i.e., the regions extending from the portions below the sidewall spacers 6 to the isolation 2. Consequently, large capacitances are caused at the pn junctions, which lowers the operating speed of the MOS transistor. In addition to the fact that such a pn junction occupies a large area, the perimeter of the pn junction abutting on the isolation 2 is also large, resulting in the occurrence of considerable leakage current at the pn junction.

However, if the area occupied by the pn junction is reduced, higher operating speed of the MOS transistor and reduced leakage current at the junction can be expected. To meet the expectations, it is required to reduce the area occupied by the heavily doped source/drain regions in the MOS transistor with the LDD structure, while it is required to reduce the area occupied by the source/drain regions in the MOS transistor without the LDD structure. However, in the semiconductor device shown in FIG. 10, if consideration is given to the margin of mask alignment between the mask for patterning the isolation 2 and the mask for patterning the gate electrode 5 and to the margin of mask alignment between these masks and the mask for patterning contact holes which provide contact between overlying wiring and the source-drain regions, it becomes necessary to provide a sufficiently long distance between the gate electrode 5 and the isolation 2 and to provide a sufficient contact area. Thus, in the structure of a conventional semiconductor device, it is difficult to reduce the area occupied by the source/drain regions, so that it is difficult to implement higher operating speed of the MOS transistor and reduced leakage current at the pn junction.

In the case where the n-channel MOS transistor and the p-channel MOS transistor are disposed in the same semiconductor device so that it performs circuit operation, the source/drain region into which an $n^+$ impurity has been diffused and the source/drain region into which a $p^+$ impurity has been diffused come close to each other, so that latchup is easily caused by the formation of a so-called pnp parasitic transistor or npn parasitic transistor.

SUMMARY OF THE INVENTION

A first object of the present invention is to provide a semiconductor device in which a MISFET is disposed, wherein the area occupied by source/drain regions of the MISFET is significantly reduced, thereby reducing leakage current caused at a pn junction.

In addition to the above first object, a second object of the present invention is to provide a semiconductor device in which the region required for an isolation is reduced.

A third object of the present invention is to provide a method of manufacturing a semiconductor device in which a MISFET is disposed, wherein the area occupied by source/drain regions of the MISFET is significantly reduced, thereby reducing leakage current caused at a pn junction.

In addition to the above third object, a fourth object of the present invention is to provide a method of manufacturing a semiconductor device in which the region required for an isolation is reduced.

On the precondition for attaining the above first and second objects, in a first semiconductor device of the present invention is disposed a MISFET having the following structure in an active region provided in a portion of a semiconductor substrate.

That is, the MISFET comprises: a gate insulating film formed on the above active region; a gate electrode formed on the above gate insulating film; a pair of sidewall insulating films formed on the side faces of the above gate electrode; and a pair of source/drain regions formed in the regions interior to those portions of the above semiconductor substrate located 0.2 µm exterior to the above sidewall insulating films.

In the semiconductor device having the foregoing structure, the source/drain regions of the MISFET are not formed beyond the limit of 0.2 µm exterior to the sidewall insulating films on both sides of the gate, so that the area occupied by the source/drain regions is significantly reduced, thereby reducing the area of a pn junction, which also serves as the boundary with the underlying semiconductor substrate. Consequently, the MISFET is operated at a higher speed, while the leakage current caused at the pn junction is reduced.

To attain the above first object, a second semiconductor device of the present invention further comprises: an isolation surrounding the above active region; and insulating films for capacitance reduction formed in those regions of the above semiconductor substrate located between the source/drain regions of the above MISFET and the isolation so that spaces are interposed between the above sidewall insulating films and the insulating films for capacitance reduction themselves.

It is possible to add the following elements to the second semiconductor device.

It is possible to provide concave portions in those regions of the above semiconductor substrate located between the above sidewall insulating films and the above isolation and which have a difference in level at the outer edges of the sidewall insulating film and to form the above insulating films for capacitance reduction on the bottom faces of the above concave portions, so that the spaces between the above sidewall insulating films and the above insulating films for capacitance reduction correspond to the sidewalls of the above concave portions on one side.

With the structure, since the outer edges of the source/drain regions define the sidewalls of the concave portions, diffusion is not caused by a heat treatment of the MISFET or the like, so that the area of the source/drain regions is kept particularly small.

Moreover, it is also possible to provide conductive members which abut on at least those source/drain regions of the above semiconductor substrate located between the sidewall insulating films and the insulating films for capacitance reduction. The conductive members may be direct contact portions between the overlying wiring and the source/drain regions. Alternatively, the conductive members may be withdrawn electrodes for providing a sufficient contact area between the overlying wiring and the source/drain regions. With the provision of the withdrawn electrodes, in particular, the area of the source/drain regions can be reduced, while implementing a large contact area between the overlying wiring and the source/drain regions.

By composing each of the above source/drain regions of a heavily doped source/drain region and of a lightly doped source/drain region, a MISFET with the so-called LDD structure is implemented, so that a semiconductor device in which such a MISFET is disposed presents superior characteristics.

It is possible to provide silicide layers between the above withdrawn electrodes and the above source/drain regions. Consequently, the resistance value of the MISFET can be reduced.

To attain the above second object, in a third semiconductor device of the present invention, the above insulating films for capacitance reduction function as isolations at least in a cross section perpendicular to the gate electrodes.

With the structure, the region required for a conventional isolation composed of a LOCOS film becomes unnecessary so that the interval between each adjacent two MISFETs is reduced significantly. Consequently, there can be achieved considerably high integration of the MISFETs.

In the above third semiconductor device, it is possible to separate the individual MISFETs by means of LOCOS films or the like.

It is possible to add, to the third semiconductor apparats, the same elements added to the above second semiconductor device.

Next, to attain the above third object, a first manufacturing method of the present invention, as a method of manufacturing a semiconductor device in which at least one MISFET having a gate electrode, a gate insulating film, and source/drain regions is disposed in a portion of a semiconductor substrate, comprises the steps of: forming an isolation on the semiconductor substrate so that active regions are surrounded by the isolation; forming the gate electrodes via the gate insulating films on the active regions of the above semiconductor substrate; after the above step of forming the gate electrodes, forming pairs of sidewall insulating films made of an insulating material on the side faces of the above gate electrodes; forming the source/drain regions in the regions interior to those portions of the above semiconductor substrate located 0.2 µm exterior to the above sidewall insulating films, and after the above step of forming the sidewall insulating films, forming insulating films for capacitance reduction in the regions located between the above source/drain regions and the above isolation so that spaces are interposed between the above sidewall insulating films and the above insulating films for capacitance reduction.

By the method, the above second semiconductor can be manufactured easily.

Moreover, it is possible to provide, after the above respective steps, an additional step of forming conductive members on at least the source/drain regions located between the above sidewall insulating films and the above insulating films for capacitance reduction.

In addition to the above first manufacturing method, it is possible to further provide the step of forming concave portions in those regions of the above semiconductor substrate located between the above sidewall insulating films and the above isolation, the above concave portions having a difference in level at the outer edges of the sidewall insulating films, so that after the step of forming the above concave portions, in the above step of forming the insulating films for capacitance reduction, an anti-oxidization film having a high etch selectivity with respect to the above sidewall insulating films is deposited over the entire surface of the substrate, the above anti-oxidization film is anisotropically etched and left at least on the sidewalls of the concave portions, the semiconductor substrate exposed on the bottom faces of the concave portions is oxidized, and the above anti-oxidization film is removed so that the sidewalls of the concave portions correspond to the above spaces between the above insulating films for capacitance reduction and the above sidewall insulating films.

Moreover, in addition to the above first manufacturing method, it is possible, in the above step of forming the insulating films for capacitance reduction, to form spaces between the insulating films for capacitance reduction and the sidewall insulating films by depositing the insulating films for capacitance reduction made of a material having a high etch selectivity with respect to the material composing the sidewall insulating films on those regions of the above semiconductor substrate located between the above sidewall insulating films and the above isolation and then etching back the above sidewall insulating films by a specified thickness.

The above step of introducing an impurity for forming the source/drain regions is performed, after the above step of forming the insulating films for capacitance reduction, by tilted ion implantation whereby ions of a first-conductivity-type impurity are implanted into the semiconductor substrate through the above spaces between the insulating films for capacitance reduction and the above sidewall insulating films.

In the case of forming a MISFET with the LDD structure, the above step of introducing an impurity for forming the source/drain regions can be performed by performing the steps of: after the above step of forming the gate electrodes and before the above step of forming the sidewall insulating films, implanting ions of a first-conductivity-type impurity at a low concentration into the semiconductor substrate in the above active regions by using the above gate electrodes as masks and after the above step of forming the insulating films for capacitance reduction, performing tilted ion implantation whereby the ions of the first-conductivity-type impurity are implanted at a high concentration into the semiconductor substrate through the above spaces between the above insulating films for capacitance reduction and the above sidewall insulating films.

It is possible to form, in the above step of forming the conductive members, a semiconductor film as the conductive members and introduce a first-conductivity-type impurity into the conductive members, while it is possible to perform the above step of implanting an impurity for forming the source/drain regions by performing the steps of: after the above step of forming the gate electrodes and before the above step of forming the sidewall insulating films, implanting ions of the first-conductivity-type impurity at a low concentration into the semiconductor substrate in the above active regions using the above gate electrodes as masks; and after the above step of forming the insulating films for capacitance reduction, diffusing the above first-conductivity-type impurity introduced into the conductive members into the semiconductor substrate through the above spaces between the insulating films for capacitance reduction and the sidewall insulating films.

In either case, the heavily doped source/drain regions can be formed easily.

In the above step of forming the conductive members, it is possible to further provide the steps of forming the conductive members made of a material for forming silicide layers and then interposing the silicide layers formed by a reaction between the above conductive members and the above semiconductor substrate between the above insulating films for capacitance reduction and the above sidewall insulating films. By the method, a MISFET with extremely low resistance can be formed.

To attain the above fourth object, in a second manufacturing method of the present invention as a method of manufacturing a semiconductor device in which a plurality of MISFETs each having a gate electrode, a gate insulating film, and source/drain regions are disposed in portions of a semiconductor substrate, it is possible to provide the steps of: forming the above gate electrodes via the above gate insulating films on active regions of the above semiconductor substrate; after the above step of forming the gate electrodes, forming pairs of sidewall insulating films made of an insulating material on the side faces of the above gate electrodes; forming the source/drain regions in the regions interior to those portions of the above semiconductor substrate located 0.2 µm exterior to the above sidewall insulating films, and after the above step of forming the sidewall insulating films, forming insulating films for capacitance reduction in the regions located between the above source/drain regions of the above individual MISFETs so that spaces are interposed between the insulating films for capacitance reduction and the above sidewall insulating films and that the above insulating films for capacitance reduction function as isolations for the MISFETs in a cross section perpendicular to the above gate electrodes.

By the manufacturing method, the above third semiconductor device can be manufactured easily.

In the above second manufacturing method, it is possible to further provide, before the above step of forming the gate electrodes, the step of forming isolations in stripes made of LOCOS films or the like on the semiconductor substrate so that, in the above step of forming the gate electrodes, the gate electrodes are formed in a direction substantially perpendicular to the above isolations in stripes.

In the above second manufacturing method, it is possible to further provide the step of forming the individual gate electrodes in discrete rectangular islands which are arranged in matrix in the step of forming the above gate electrodes; the step of forming the sidewall insulating films on each side surface of each gate electrode in the step of forming the sidewall insulating films; and the step of forming the insulating films for capacitance reduction entirely around each gate electrode in the step of forming the insulating films for capacitance reduction.

Wherein, under a LDD structure, the step of forming the gate electrodes comprises the steps of: after forming a plurality of gate wirings arranged in stripes, patterning each gate wiring to the individual rectangular gate electrodes, and after forming the stripe gate wirings and before patterning the rectangular gate electrodes, introducing a first-conductive type impurity at a low concentration into the semiconductor substrate, using the gate wirings and the gate electrode as a mask.

To the above second manufacturing method, it is possible to add the same steps as added to the above first manufacturing method.

DETAILED DESCRIPTION OF THE PREFERRED EMBODIMENTS (First Embodiment)

Figure 1:
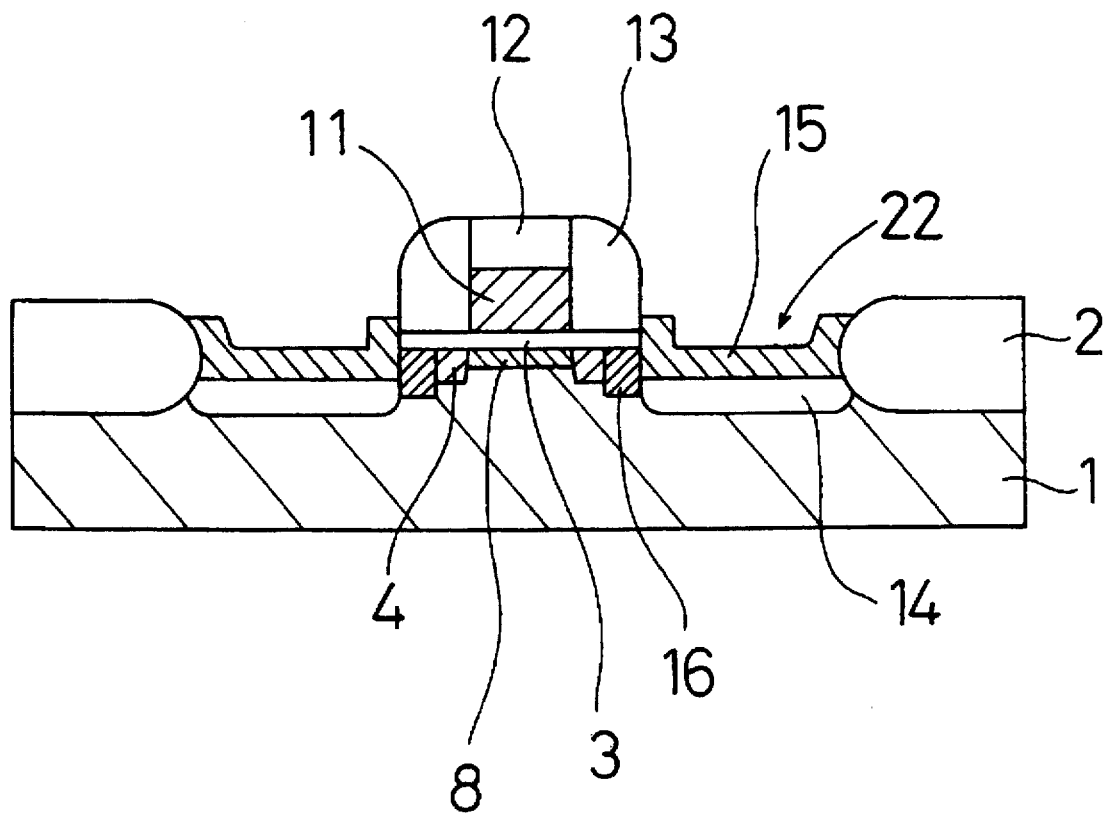
FIG. 1 is a vertical sectional view showing the structure of a semiconductor device according to a first embodiment.

FIG. 1 is a cross sectional view of a semiconductor device according to a first embodiment. As shown in the drawing, in the near-surface region of a p-type silicon substrate 1 as a semiconductor substrate is formed an isolation 2 composed of a LOCOS film or the like. In an active region surrounded by the isolation 2 is disposed a MOS transistor. The MOS transistor shown in FIG. 1 is an n-channel MOS transistor, which comprises: a gate-oxide film 3 composed of a silicon dioxide film, which is formed on the silicon substrate 1; a gate electrode 11 composed of a polysilicon film, which is formed on the gate-oxide film 3; a pair of sidewall spacers 13 composed of a silicon dioxide film, which are formed by CVD on the side faces of the gate electrode 11; and an insulating film 12 on gate composed of a silicon dioxide film, which is formed by CVD on the gate electrode 11.

The present embodiment is characterized in that these portions of the silicon substrate 1 between the respective sidewall spacers 13 and the isolation 2 are trenched from the surface of the silicon substrate 1, which is located below the gate electrode 11 and the sidewall spacers 13, thus forming concave portions 22 having a difference in level at the outer edges of the sidewall spacers 13. Lightly doped source/drain regions 4 doped with an $n^-$ impurity and heavily doped source/drain regions 16 doped with an $n^+$ impurity are substantially contained in regions located below the sidewall spacers 13 of the silicon substrate 1. Between the lightly doped source/drain regions 4 is formed a channel region 8 doped with a p-type impurity for controlling the threshold voltage.

In the concave portions 22 are formed insulating films 14 for capacitance reduction composed of silicon dioxide films, which are formed on the silicon substrate 1. On the insulating films 14 for capacitance reduction are formed withdrawn electrodes 15 made of a conductive material. The withdrawn electrodes 15 are made of a semiconductor material containing an impurity (e.g., polysilicon into which arsenic has been introduced), a silicide (e.g., tungsten silicide (WSi) into which As has been introduced), and a metal material such as tungsten (W), titanium (Ti), or aluminum (Al). The withdrawn electrodes 15 abut on the heavily doped source/drain regions 16 between the sidewall spacers and the insulating films for capacitance reduction, so that the withdrawn electrodes 15 are electrically connected to the heavily doped source/drain regions 16. Over the withdrawn electrodes 15 are formed overlying wiring via an interlayer insulating film, so that the overlying wiring and the withdrawn electrodes 15 are electrically connected to each other via contact portions buried in contact holes formed in the interlayer insulating film.

In the n-channel MOS transistor with the structure shown in FIG. 1, the heavily doped source/drain regions 16 are formed only below the respective sidewall spacers 13, so that the areas between the heavily doped source/drain regions 16 and the silicon substrate 1 are extremely small and therefore pn junction capacitances are small. Moreover, since the withdrawn electrodes 15 are separated from the silicon substrate 1 by the insulating films 14 for capacitance reduction, the capacitances between the withdrawn electrodes 15 and the silicon substrate 15 are extremely small. Hence, even when large areas are given to the withdrawn electrodes 15 in order to form contact portions, the overall capacitance is small, so that the operating speed of the MOS transistor can be increased. On the other hand, since the area of the pn junction and the perimeter of the pn junction are small, the leakage current flowing through the pn junction is also small.

Furthermore, since the heavily doped source/drain regions 16 are formed only below the respective sidewall spacers 13, even when the n-channel MOS transistor and the p-channel MOS transistor are formed in the same silicon substrate, the respective source/drain regions of the transistors are isolated from each other by the isolation and the two insulating films for capacitance reduction, so that latchup resulting from the occurrence of the parasitic transistor can be suppressed effectively. This enables a reduction in the width of the isolation 2 in cross section of the semiconductor device shown in FIG. 1, so that the MOS transistors can advantageously be integrated with the semiconductor device at high density.

Next, a description will be given to a process of manufacturing the semiconductor device according to the present embodiment with reference to FIGS. 2a to 2j, which are cross sectional views showing the transition of the structure of the semiconductor device according to the present embodiment in the manufacturing process thereof.

Figure 2A:
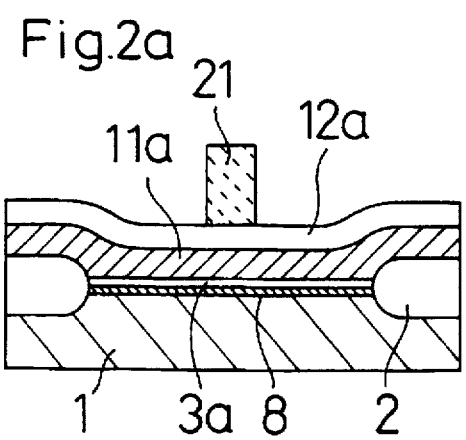
FIGS. 2a to 2j are vertical sectional views showing the transition of the structure of the semiconductor device according to the first embodiment in the manufacturing process thereof.

Initially, there will be described the steps performed till the semiconductor device gains the structure shown in FIG. 2a. On the silicon substrate 1 is formed the isolation 2. On the active region of the silicon substrate 1 surrounded by the isolation is formed a protective oxide film (not shown). Subsequently, ions of an impurity (e.g., $BF^{2+}$) for controlling the threshold voltage (Vt) are implanted from above, thereby forming a layer which will serve as the channel region 8. After removing the protective oxide film, the near-surface region of the silicon substrate 1 in the active region is oxidized, thereby forming a thermal oxide film 3a which will serve as the gate-oxide film. On the thermal oxide film 3a is further deposited a polysilicon film 11a having a thickness of 200 nm by CVD, which will serve as the gate electrode. Into the polysilicon film 11a is diffused phosphorus (P) or the like, which turns the polysilicon film 11a into the n⁺ polysilicon. On the polysilicon film 11a is further deposited a CVD oxide film 12a having a thickness of 150 nm, which will serve as an insulating film on gate. A resist mask 21 is formed in the gate electrode formation region of the CVD oxide film 12a.

Figure 2F:
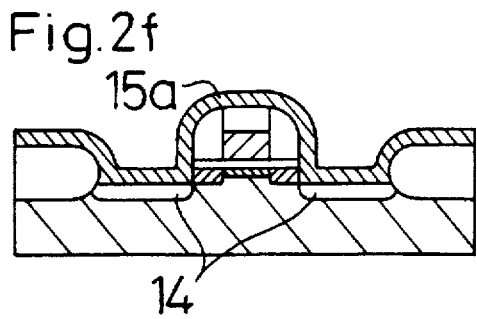
Figure 2B:
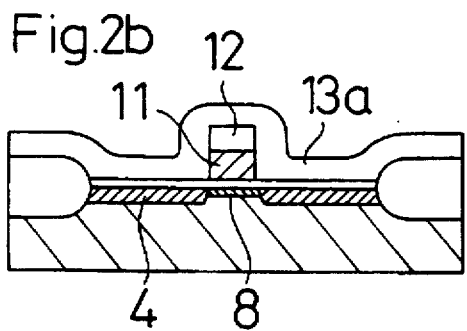

Next, there will be performed the following steps till the structure shown in FIG. 2b is achieved. The polysilicon film 11a and the CVD oxide film 12a are anisotropically etched using the resist mask 21, thereby forming the gate electrode 11 and the insulating film on gate 12. After that, arsenic ions (As⁺) are implanted at a low concentration using the gate electrode 11 as a mask, thereby forming the lightly doped source/drain regions 4 for the LDD structure. Subsequently, a CVD oxide film 13a for forming the sidewall spacers is deposited by CVD to a thickness of 130 nm over the entire surface of the substrate.

Figure 2G:
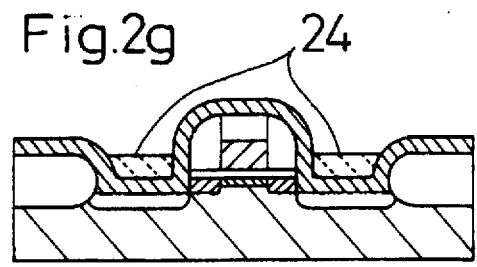
Figure 2C:
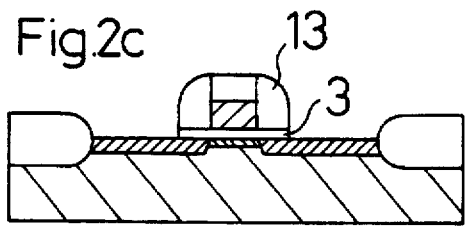

Next, as shown in FIG. 2c, the CVD oxide film 13a is anisotropically etched by dry etching or like technique, thereby forming a pair of sidewall spacers 13 on the side faces of the gate electrode 11. In this step, those portions of the thermal oxide film 3a which are exterior to the sidewall spacers 13 are removed by performing overetching, thus forming the gate-oxide film 3.

Figure 2H:
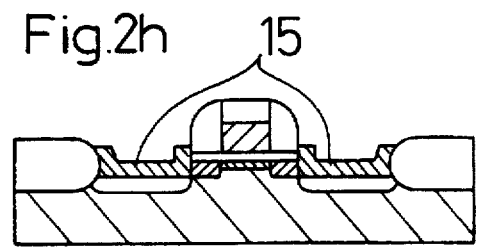
Figure 2D:
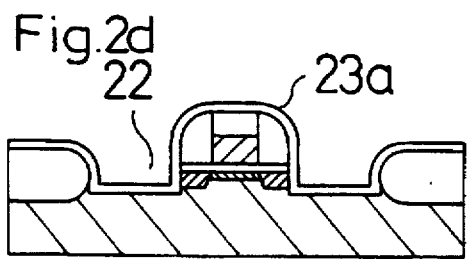

Next, there will be performed the following steps till the structure shown in FIG. 2d is achieved. The silicon substrate 1 in the active region is etched to a depth of 300 nm from the surface thereof using the isolation 2, the oxide film 12 on gate, and the sidewall spacers 13 as a mask, thereby forming the concave portions 22. Subsequently, the surface of the silicon substrate 1 in the concave portions 22 is oxidized to form an underlying oxide film (not shown), followed by the deposition of a silicon nitride film 23a to a thickness of 100 nm over the entire surface of the substrate.

Figure 2I:
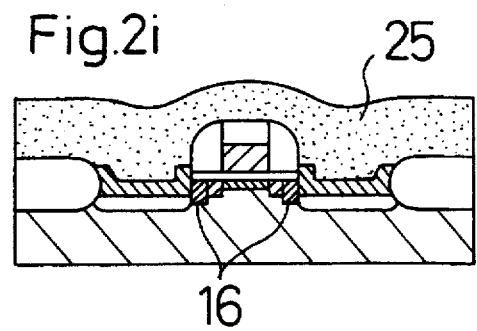
Figure 2E:
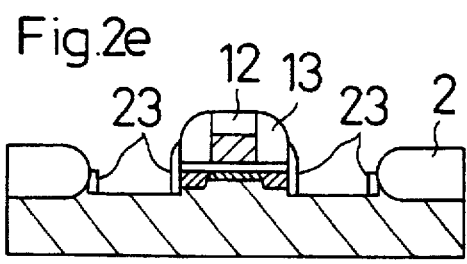

Next, as shown in FIG. 2e, the silicon nitride film 23a is subjected to anisotropical etching so that the silicon nitride film 23a is left only in the regions extending from the lower edges of the sidewall spacers 13 to the edges of the concave portions 22 and in the regions extending from the lower edges of the isolation 2 to the side faces of the concave portions 22, thus forming a mask 23 for oxidization.

Next, there will be performed the following steps till the structure shown in FIG. 2f is achieved. The near-surface region of the silicon substrate 1 in the concave portions 22 is oxidized, thereby forming the insulating films 14 for capacitance reduction. During oxidization, bird's beak occurs at the bottom of the mask 23 for oxidization composed of the silicon nitride film, so that the insulating films 14 and the isolation 2 are brought into contact with each other. On the other hand, the surface of the gate electrode 11 is also oxidized through the oxide film 12 on gate and through the sidewall spacers 13. After that, etching is performed using a phosphoric acid, thereby removing the mask 23 for oxidization composed of the silicon nitride film. During etching, only the silicon nitride film 23 is removed and the underlying oxide film remains on the sidewalls of the concave portions 22. Subsequently, the underlying oxide film is removed so as to expose the silicon substrate 1 on the side faces of the concave portions 22. Thereafter, a polysilicon film 15a which will serve as the withdrawn electrodes is deposited to a thickness of 200 nm over the entire surface of the substrate. Furthermore, arsenic ions (As⁺) are diffused into the polysilicon film 15a, which turns the polysilicon film 15a into the n⁺ polysilicon.

Next, as shown in FIG. 2g, the entire surface of the substrate is coated with a resist by rotational coating, followed by etch back. As a result, the resist remains only in the concave portions 22, resulting in a resist mask 24.

Next, as shown in FIG. 2h, the polysilicon film 15a is etched using the resist mask 24 to form the withdrawn electrodes 15, followed by the removal of the resist mask 24.

Next, as shown in FIG. 2i, a BPSG film 25 which will serve as the interlayer insulating film is deposited to a thickness of 600 nm over the entire surface of the substrate. The resulting BPSG film 25 is then subjected to a heat treatment at 850° C. for causing reflow in the BPSG film 25. During the reflow process, arsenic (As) in the withdrawn electrodes 15 is diffused into the silicon substrate 1, thus forming the heavily doped source/drain regions 16.

Figure 2J:
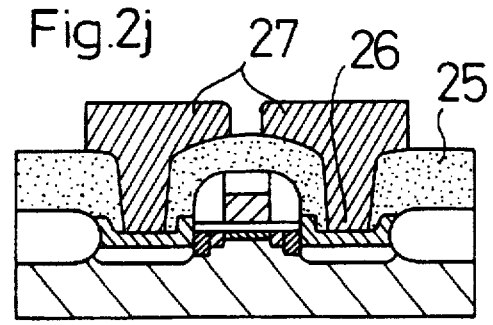

Next, as shown in FIG. 2j, the contact portions 26 are formed by burying tungsten plugs in the contact holes penetrating the BPSG film 25. After that, Al wiring 27 is formed on the BPSG film 25.

In accordance with the foregoing manufacturing process of the first embodiment, the semiconductor device with the structure shown in FIG. 1, in which the MOS transistor is disposed, can be formed. Consequently, the capacitance and leakage current at a pn junction of the MOS transistor are reduced, while the interval of the isolation is also reduced, thereby enhancing the latchup resistance and achieving higher integration.

(Second Embodiment)

Next, a second embodiment will be described. FIGS. 3a to 3j are cross sectional views showing the transition of the structure of a semiconductor device according to the second embodiment in the manufacturing process thereof. The steps illustrated in FIGS. 3a to 3e in the present embodiment are the same as those illustrated in FIGS. 2a to 2e in the first embodiment, so that the description thereof will be omitted.

Figure 3A:
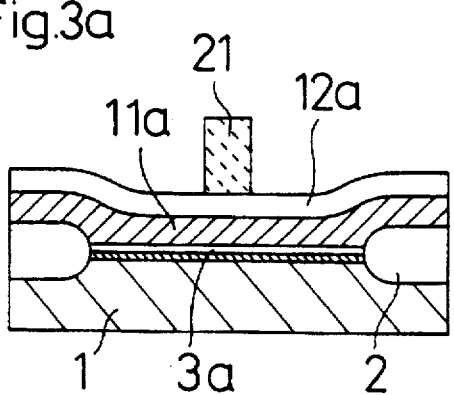
FIGS. 3a to 3j are vertical sectional views showing the transition of the structure of a semiconductor device according to a second embodiment in the manufacturing process thereof.
Figure 3B:
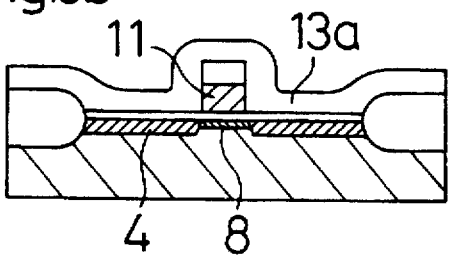
Figure 3C:
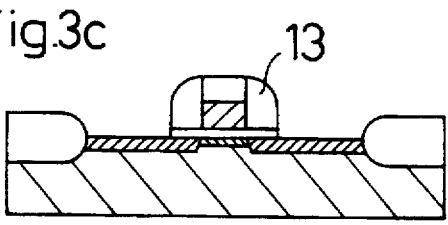
Figure 3D:
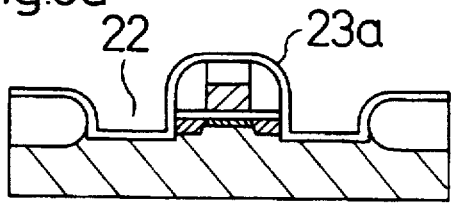
Figure 3E:
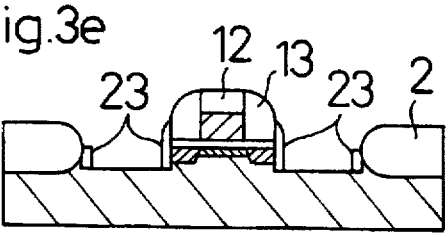
Figure 3F:
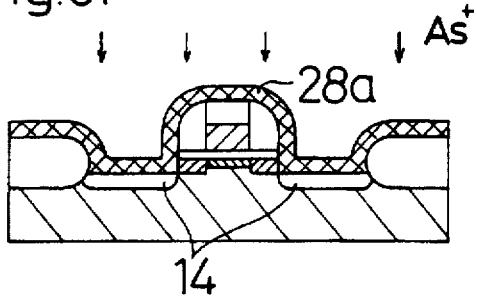

The present embodiment will perform the following steps after the concave portions 22 were formed between the sidewall spacers and the isolation till the structure shown in FIG. 3f is achieved. The near-surface region of the silicon substrate 1 in the concave portions 22 is oxidized, thereby forming the insulating films 14 for capacitance reduction composed of silicon dioxide films. Subsequently, etching is performed using a phosphoric acid, thereby removing the silicon nitride film 23. Thereafter, the underlying oxide film is removed so as to expose the silicon substrate 1 on the side faces of the concave portions 22, followed by the deposition of a tungsten silicide film (Wsi film 28a) to a thickness of 200 nm over the entire surface of the substrate. Furthermore, arsenic ions (As⁺) are implanted into the Wsi film 28a.

Figure 3G:
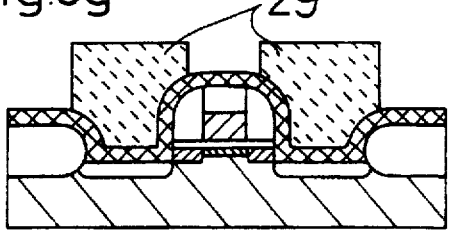

Next, as shown in FIG. 3g, the resist film 29 is formed on the WSi film 28a so as to cover the regions in which the withdrawn electrodes are to be formed.

Figure 3H:
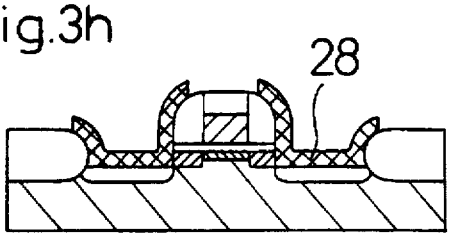

Next, as shown in FIG. 3h, the WSi film 28a is etched using the resist mask 29 to form the withdrawn electrodes 28, followed by the removal of the resist mask 29.

Figure 3I:
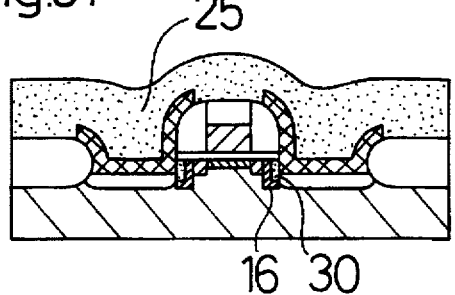

Next, as shown in FIG. 3i, a BPSG film 25 as the interlayer film is deposited to a thickness of 600 nm over the entire surface of the substrate, followed by a heat treatment at 850° C. for causing reflow in the BPSG film 25. During the reflow process, arsenic (As) and tungsten (W) in the withdrawn electrodes 28 are diffused into the silicon substrate 1, thus forming the heavily doped source/drain regions 16 and silicide layers 30.

Figure 3J:
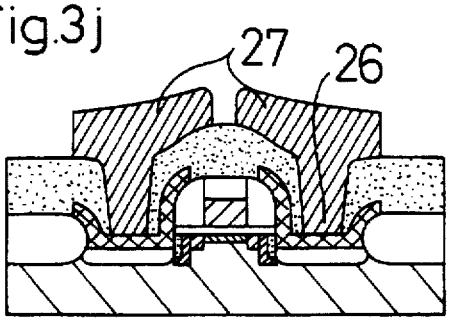

Next, as shown in FIG. 3j, the contact portions 26 are formed by burying tungsten plugs in the contact holes penetrating the BPSG film 25, followed by the formation of the Al wiring 27 on the BPSG film 25.

The MOS transistor formed by the manufacturing process of the present embodiment comprises the silicide layers 30 between the heavily doped source/drain regions 16 and the withdrawn electrodes 28, in addition to the structure substantially the same as that of the MOS transistor in the above first embodiment. Consequently, in addition to the effects achieved in the first embodiment, the resistance of the withdrawn electrodes can be reduced, which enables higher-speed operation of the MOS transistor.

Although the WSi film containing arsenic (As) is formed in the present embodiment as the WSi film 28a for forming the withdrawn electrodes 28, it is also possible to form a metal film which forms a silicide composed of another metal containing arsenic (As) or which is diffused into the silicon to form a silicide. It will be easily appreciated that the WSi film or the like may be doped with phosphorus (P), instead of arsenic (As).

(Third Embodiment)

Next, a third embodiment of the present invention will be described. FIGS. 4a to 4j are cross sectional views showing the transition of the structure of a semiconductor device according to the third embodiment in the manufacturing process thereof. Since the steps illustrated in FIGS. 4a to 4e are the same as those illustrated in FIGS. 2a to 2e in the above first embodiment, the description thereof will be omitted.

Figure 4A:
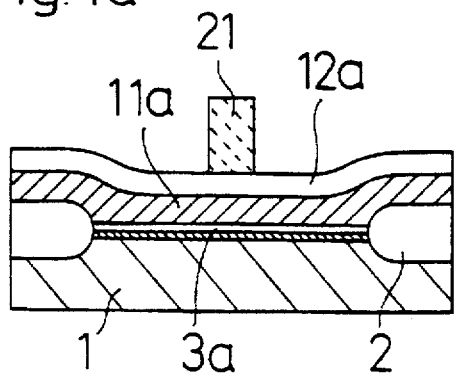
FIGS. 4a to 4j are vertical sectional views showing the transition of the structure of a semiconductor device according to a third embodiment in the manufacturing process thereof.
Figure 4B:
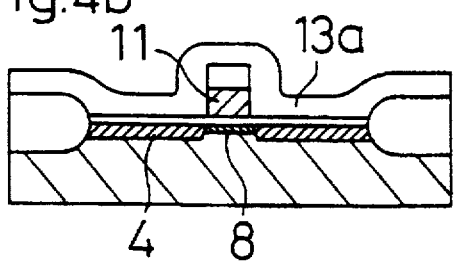
Figure 4C:
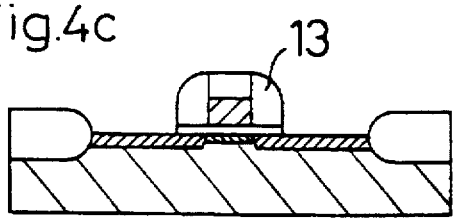
Figure 4D:
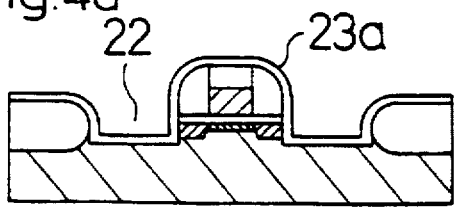
Figure 4E:
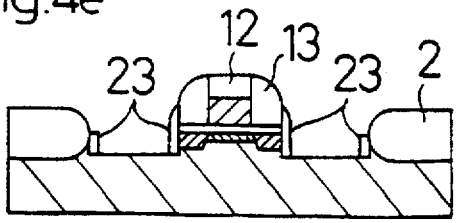
Figure 4F:
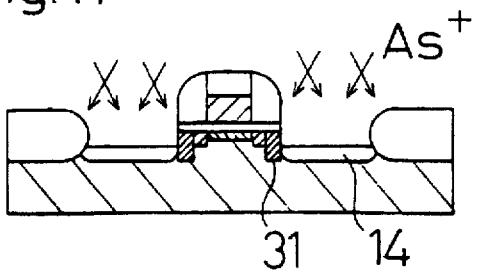

The present embodiment will perform the following steps after the formation of the concave portions 22 till the structure shown in FIG. 4f is achieved. Initially, the near-surface region of the silicon substrate 1 in the concave portions 22 is oxidized, thereby forming the insulating films 14 for capacitance reduction composed of silicon dioxide films. Subsequently, etching is performed using a phosphoric acid, thereby removing the silicon nitride film 23. Thereafter, tilted ion implantation at a tilt angle of 7 to 60 degrees, preferably at a large tilt angle of 20 to 40 degrees, is performed with the underlying oxide film remaining on the side faces of the concave portions 22, thereby implanting arsenic ions (As⁺) into the silicon substrate 1 through the sidewalls of the concave portions 22, i.e., through the spaces between the sidewall spacers and the insulating films for capacitance reduction, thereby forming the heavily doped source/drain regions 31.

Figure 4G:
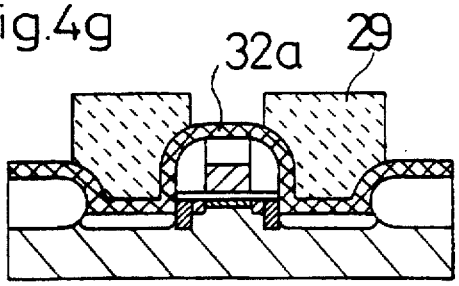

Next, as shown in FIG. 4g, the underlying oxide film is removed so as to expose the silicon substrate 1 on the side faces of the concave portions 22, followed by the deposition of a titanium film (Ti film 32a), which will serve as the withdrawn electrodes, to a thickness of 200 nm over the entire surface of the substrate. Then, a resist mask 29 is formed on the Ti film 32a so as to cover the regions in which the withdrawn electrodes are to be formed.

Figure 4H:
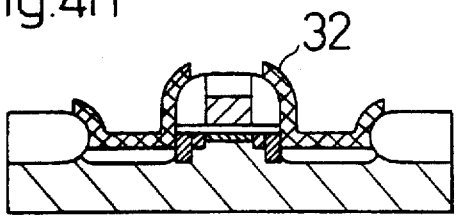

Next, as shown in FIG. 4h, the Ti film 32a is etched using the resist mask 29 so as to form the withdrawn electrodes 32, followed by the removal of the resist mask 29.

Figure 4I:
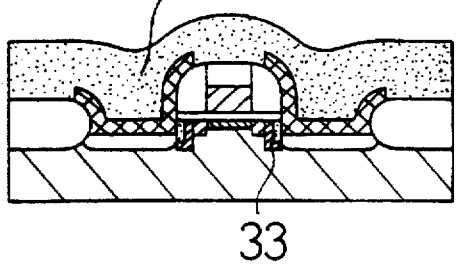

Next, as shown in FIG. 4i, the BPSG film 25 as the interlayer film is deposited to a thickness of 600 nm over the entire surface of the substrate, followed by a heat treatment at 850° C. for causing reflow in the BPSG film 25. During the reflow process, titanium (Ti) composing the withdrawn electrodes 32 reacts with silicon (Si) composing the silicon substrate 1, thereby forming the silicide layers 33 composed of titanium silicide (TiSi$^2$).

Figure 4J:
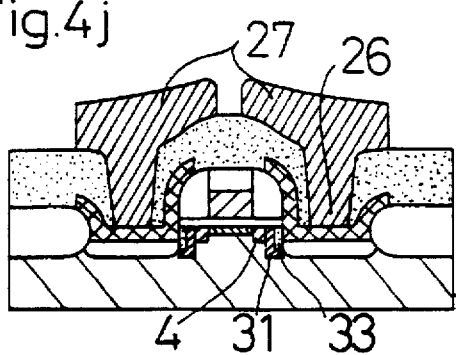

Next, as shown in FIG. 4j, the contact portions 26 are formed by burying tungsten plugs in the contact holes penetrating the BPSG film 25, followed by the formation of the Al wiring 27 on the BPSG film 25.

The structure of the MOS transistor formed by the manufacturing process of the present embodiment is basically the same as that of the MOS transistor formed by the manufacturing process of the above second embodiment. However, the manufacturing process of the present embodiment does not require the heat treatment for forming the heavily doped source/drain regions by impurity diffusion from the withdrawn electrodes, which is required by the manufacturing processes of the first and second embodiments, since the high-concentration source drain regions 31 are formed by ion implantation in the present embodiment. Hence, the manufacturing process of the present embodiment is advantageous in that the impurity concentration of the heavily doped source/drain regions 31 can be controlled easily, which can suppress the deterioration of the transistor characteristic due to the carrier effect. Although the Ti film is formed as a film composing the withdrawn electrodes in the manufacturing process of the third embodiment, it is also possible to use a tungsten film (W film) or an aluminum film (Al film), instead of the Ti film.

(Fourth Embodiment)

Next, a fourth embodiment of the present invention will be described. FIGS. 5a to 5j are cross sectional views showing the transition of the structure of a semiconductor device according to the fourth embodiment in the manufacturing process thereof.

Figure 5A:
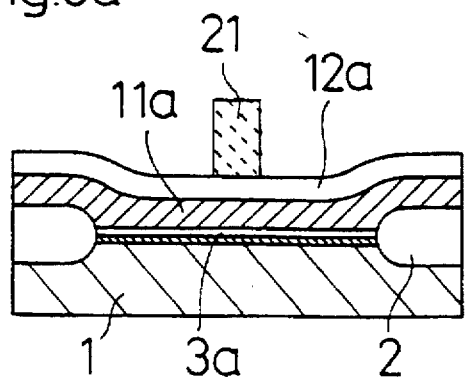
FIGS. 5a to 5j are vertical sectional views showing the transition of the structure of a semiconductor device according to a fourth embodiment in the manufacturing process thereof.
Figure 5B:
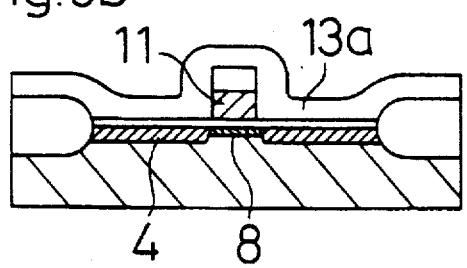

As shown in FIGS. 5a and 5b, the same process (shown in FIGS. 2a and 2b, etc.) as performed in the above individual embodiments will be performed in the present embodiment after the MOS transistor was formed till the CVD oxide film 13a for forming the sidewall spacers is formed over the entire surface of the substrate.

Figure 5C:
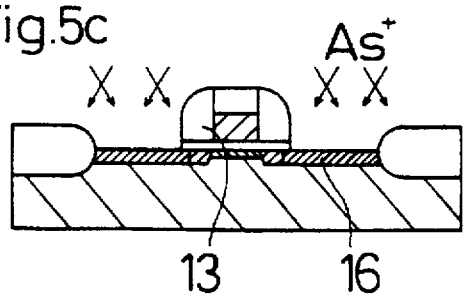
Figure 5D:
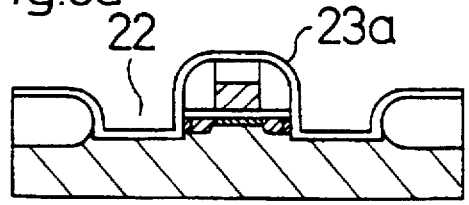
Figure 5E:
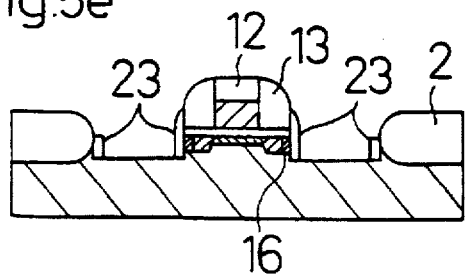
Figure 5F:
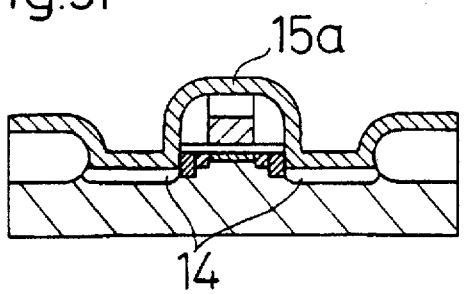
Figure 5G:
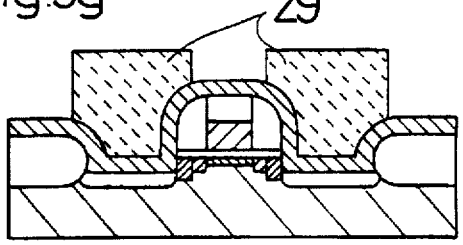
Figure 5H:
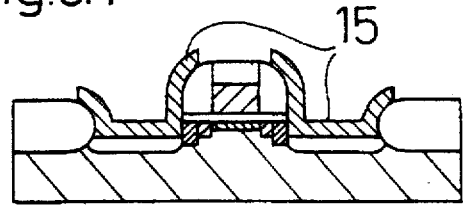
Figure 5I:
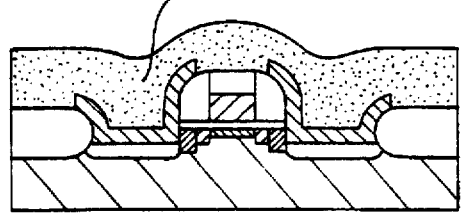
Figure 5J:
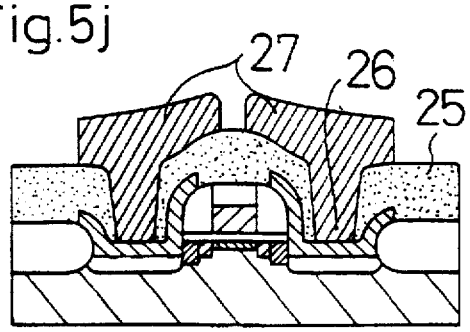

As shown in FIG. 5c, the present embodiment is characterized in that, after the formation of the sidewall spacers 13, the silicon substrate 1 is doped with arsenic ions (As⁺) by tilted ion implantation using the gate electrode 11 and the sidewall spacers 13 as a mask. As a result of the ion implantation, the heavily doped source/drain regions 16 are formed not only in those regions of the silicon substrate 1 located between the sidewall spacers and the isolation, but also in those regions of the silicon substrate 1 located below the sidewall spacers 13.

After that, the steps of forming the concave portions 22, forming the insulating films 14 for capacitance reduction, forming the withdrawn electrodes 15, and the like are performed, as shown in FIGS. 5d to 5j. The procedures in these steps are substantially the same as those described with respect to FIGS. 2d to 2j in the above first embodiment, except that the present embodiment does not perform doping with an impurity from the withdrawn electrodes 15, since the heavily doped source/drain regions 16 have already been formed.

(Fifth Embodiment)

Next, a fifth embodiment will be described. FIGS. 6a to 6j show the transition of the structure of a semiconductor device according to a fifth embodiment in the manufacturing process thereof. Since the steps illustrated in FIGS. 6a to 6c in the first embodiment are the same as those illustrated in FIGS. 2a to 2c in the above first embodiment, the description thereof will be omitted.

Figure 6A:
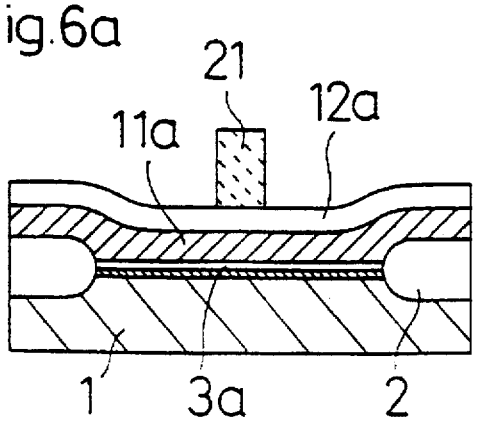
FIGS. 6a to 6j are vertical sectional views showing the transition of the structure of a semiconductor device according to a fifth embodiment in the manufacturing process thereof.
Figure 6B:
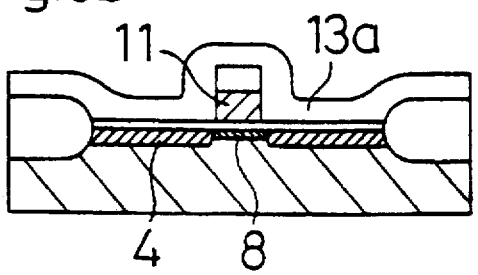
Figure 6C:
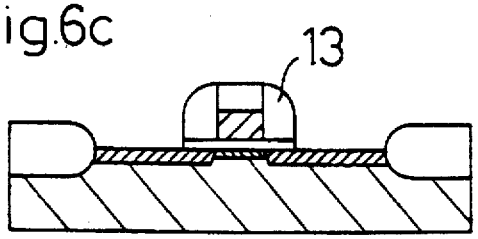
Figure 6D:
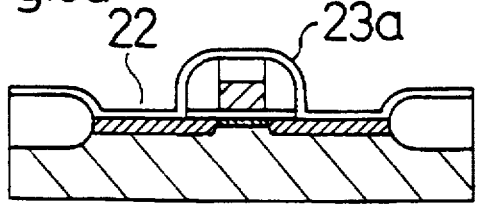

As shown in FIG. 6d, the present embodiment is characterized in that, after the formation of the MOS transistor with the sidewall spacers 13, the silicon nitride film 23a is deposited to a thickness of 100 nm over the entire surface of the substrate without forming the concave portions.

Figure 6E:
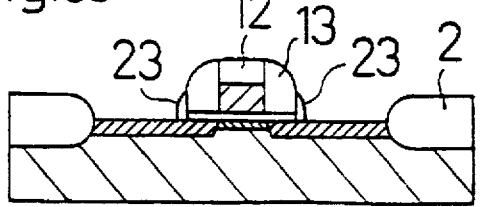

Next, as shown in FIG. 6e, the silicon nitride film 23a is subjected to anisotropic etching for leaving the silicon nitride film 23a only on the lower side faces of the sidewall spacers 13, thereby forming the mask 23 for oxidization.

Figure 6F:
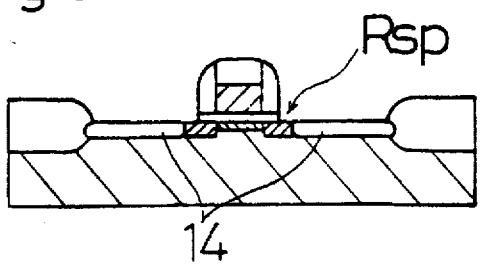

Next, there will be performed the following steps till the structure shown in FIG. 6f is achieved. The near-surface region of the silicon substrate 1 between the mask for oxidization and the isolation is oxidized, thereby forming the insulating films 14 for capacitance reduction. Subsequently, etching is performed using a phosphoric acid, thereby removing the mask 23 for oxidization composed of a silicon nitride film. After that, the sidewall spacers 13 are etched back by isotropic etching so as to form spaces Rsp between the sidewall spacers and the insulating films for capacitance reduction, thereby exposing the surfaces of the lightly doped source/drain regions 4 of the silicon substrate 1 in these regions.

Figure 6G:
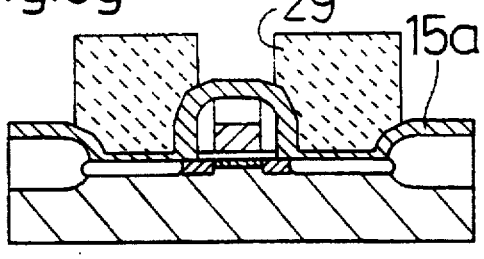

Next, as shown in FIG. 6g, the polysilicon film 15a which will serve as the withdrawn electrodes is deposited to a thickness of 200 nm over the entire surface of the substrate, followed by the implantation of arsenic ions (As$^+$) into the polysilicon film 15a, thereby turning the polysilicon film 15a into the n$^+$ polysilicon. After that, the resist mask 29 is formed to cover the regions in which the withdrawn electrodes are to be formed.

Figure 6H:
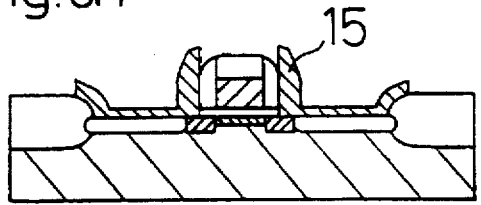

Next, as shown in FIG. 6h, the polysilicon film 15a is etched using the resist mask 29 so as to form the withdrawn electrodes 15, followed by the removal of the resist mask 29.

Figure 6I:
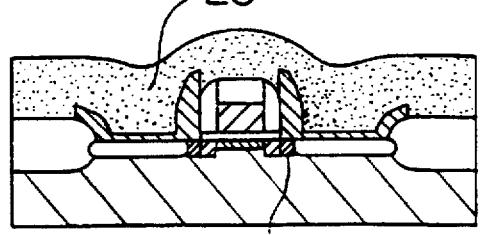

Next, as shown in FIG. 6i, the BPSG film 25 which will serve as the interlayer insulating film is deposited to a thickness of 600 nm over the entire surface of the substrate, followed by a heat treatment at 850° C. for causing reflow in the BPSG film 25. During the reflow process, arsenic (As) in the withdrawn electrodes 15 is diffused into the silicon substrate 1, thereby forming the heavily doped source/drain regions 16.

Figure 6J:
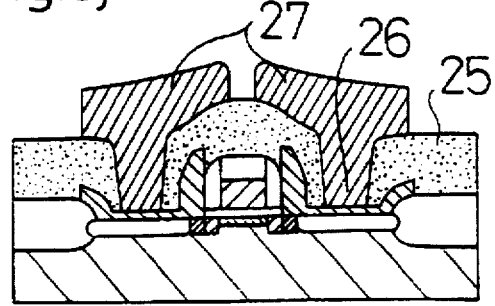

Next, as shown in FIG. 6j, the contact portions 26 are formed by burying tungsten plugs in the contact holes penetrating the BPSG film 25, followed by the formation of the Al wiring 27 on the BPSG film 25.

As shown in FIGS. 6a to 6j, the present embodiment utilizes, without forming the concave portions, the etching back of the sidewall spacers 13 by isotropic etching in order to form the heavily doped source/drain regions 16 and to provide interconnections between the heavily doped source/drain regions and the withdrawn electrodes. Consequently, the present embodiment has an advantage over the above individual embodiments in that the manufacturing process thereof is comparatively simple.

Although the heavily doped source/drain regions 16 were formed by impurity diffusion from the withdrawn electrodes 15 in the steps illustrated in FIGS. 6a to 6j, it is also possible to introduce impurity ions into the silicon substrate 1 by, e.g., tilted ion implantation or like technique in the state shown in FIG. 6f.

(Sixth Embodiment)

Next, a sixth embodiment of the present invention will be described. FIGS. 7a to 7j are cross sectional views showing the transition of the structure of a semiconductor device according to the six embodiment in the manufacturing process thereof. Since the steps illustrated in FIGS. 7a to 7g in the present embodiment are the same as those illustrated in FIGS. 4a to 4f in the above third embodiment, the description thereof will be omitted. However, FIG. 7f of the present embodiment shows a transient structure between the steps illustrated in FIGS. 4e and 4f.

Figure 7A:
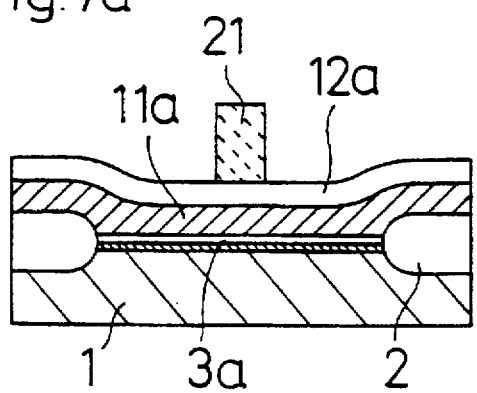
FIGS. 7a to 7j are vertical sectional views showing the transition of the structure of a semiconductor device according to a sixth embodiment in the manufacturing process thereof.
Figure 7B:
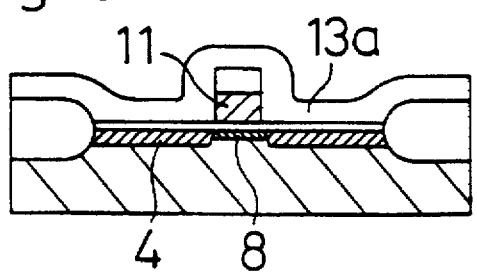
Figure 7C:
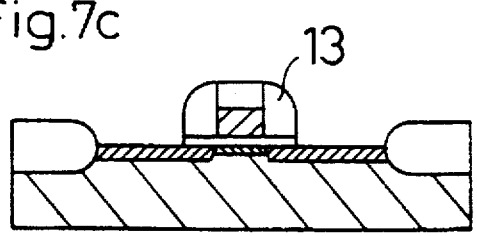
Figure 7D:
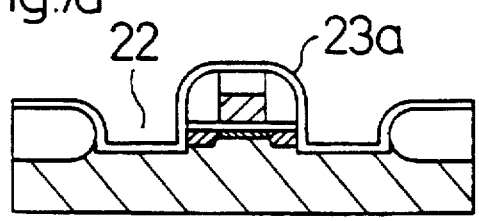
Figure 7E:
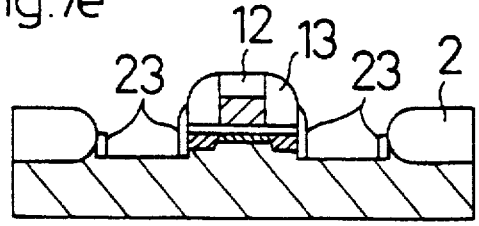
Figure 7F:
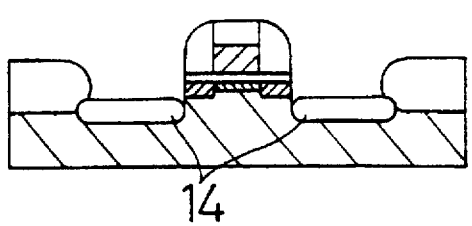
Figure 7G:
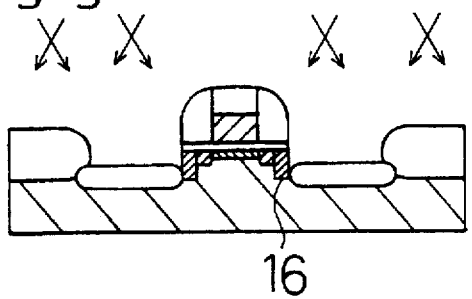
Figure 7H:
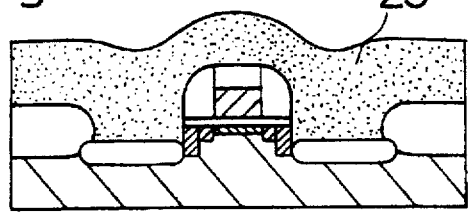

As shown in FIG. 7h, the BPSG film 25 which will serve as the interlayer insulating film is deposited to a thickness of 600 nm over the entire surface of the substrate, followed by a heat treatment at 850° C. for causing reflow in the BPSG film 25.

Figure 7I:
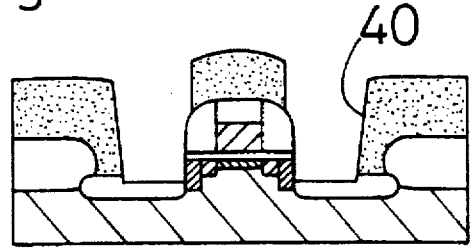

Next, as shown in FIG. 7i, contact holes 40 are formed to penetrate the BPSG film 25. The present embodiment is characterized in that, in this step, the contact holes 40 are formed to a depth reaching the heavily doped source/drain regions 16 between the sidewall spacers and the insulating films.

Figure 7J:
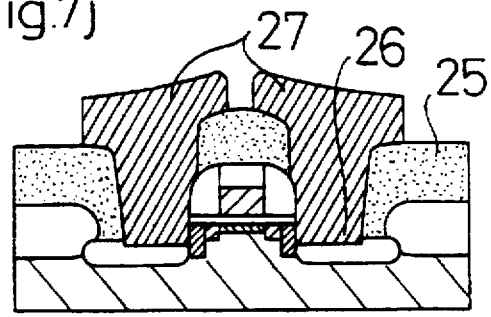

Next, as shown in FIG. 7j, the contact portions 26 are formed by burying tungsten plugs in the contact holes 40, followed by the formation of the Al wiring 27 on the BPSG film 25.

In the structure of the present embodiment, the overlying Al wiring 27 comes into direct contact with the heavily doped source/drain regions 16 via the contact portions 26, without the interposition of the withdrawn electrodes. Consequently, the present embodiment can omit the step of forming the withdrawn electrodes, which simplifies the manufacturing process accordingly.

(Seventh Embodiment)

Next, a seventh embodiment of the present invention will be described. FIGS. 8a to 8j are cross sectional views showing the transition of a semiconductor device according to the seventh embodiment in the manufacturing process thereof.

Figure 8A:
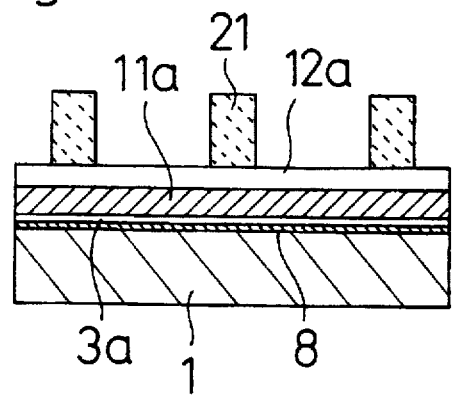
FIGS. 8a to 8j are vertical sectional views showing the transition of the structure of a semiconductor device according to a seventh embodiment in the manufacturing process thereof.
Figure 8B:
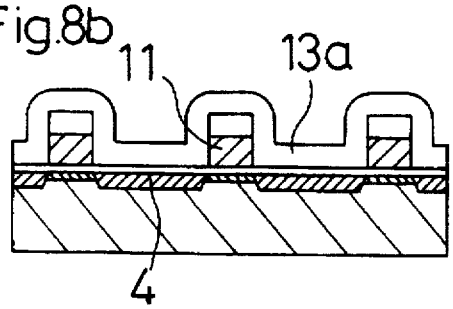
Figure 8C:
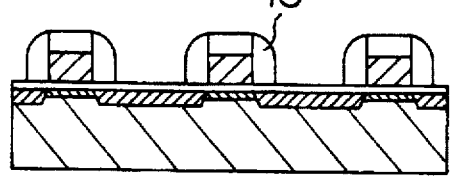

Initially, there will be described the steps performed till the semiconductor device gains the structure shown in FIG. 8a. In the present embodiment, LOCOS films in stripes (not shown) are formed on the silicon substrate 1. In FIGS. 8a to 8j, however, the LOCOS films are not shown since they show the structure of the semiconductor device in a cross section parallel to the LOCOS films in the active regions which are sandwiched between the LOCOS films in stripes. The protective oxide films (not shown) are formed on the silicon substrate 1 in the active regions separated by the isolations 2. Thereafter, ions of an impurity for controlling the threshold voltage (Vt) are implanted from above, thereby forming a layer which will serve as the channel regions 8. After removing the protective oxide films, the near-surface region in the active regions of the silicon substrate 1 is oxidized so as to form the thermal oxide film 3a, which will serve as the gate-oxide films. On the thermal oxide film 3a is further deposited the polysilicon film 11a, which will serve as the gate electrodes, by CVD to a thickness of 200 nm. Into the polysilicon film 11a is diffused phosphorus (P) or the like, thereby turning the polysilicon film 11a into the n$^+$ polysilicon. On the polysilicon film 11a, the CVD oxide film 12 which will serve as the insulating films on gate is further deposited by CVD to a thickness of 150 nm. The resist masks 21 are formed in the gate electrode formation regions of the CVD oxide film 12.

Next, there will be performed the steps illustrated in FIGS. 8b to 8f, which are basically the same as those illustrated in FIGS. 2b to 2f in the above first embodiment. In the present embodiment, however, the silicon substrate 1 between each adjacent two MOS transistors is trenched to a specified depth so as to form the concave portion 22 between the sidewall spacers 13 belonging to different MOS transistors. The near-surface region of the silicon substrate 1 in the concave portions 22 is oxidized, thereby forming the insulating films 14 for capacitance reduction, which also serve as the isolations. After that, the polysilicon film 15a which will serve as the withdrawn electrodes is deposited over the entire surface of the substrate and the resulting polysilicon film 15a is doped with arsenic (As).

Figure 8D:
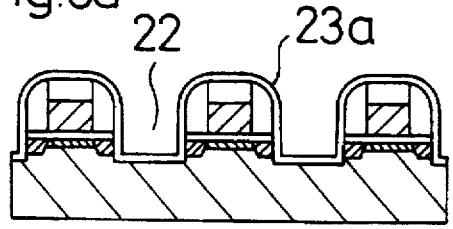
Figure 8E:
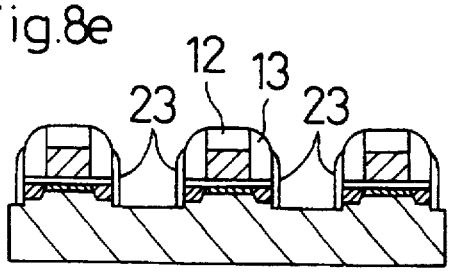
Figure 8F:
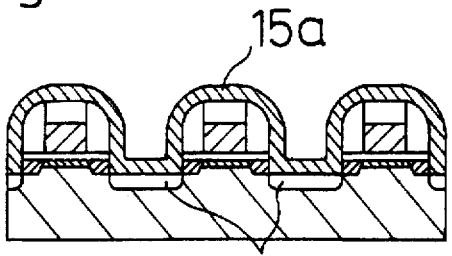
Figure 8G:
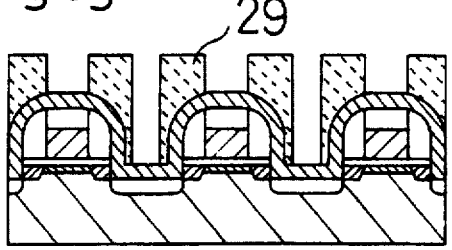

Next, as shown in FIG. 8g, the resist mask 29 is formed on the polysilicon film 15a so as to cover the regions in which the withdrawn electrodes are to be formed.

Figure 8H:
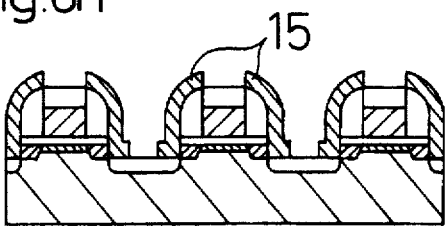

Next, as shown in FIG. 8h, the polysilicon film 15a is etched using the resist mask 29, thereby forming the withdrawn electrodes 15. The withdrawn electrodes belonging to the adjacent two MOS transistors, respectively, are separated above the near-center region of the insulating films 14 for capacitance reduction.

Figure 8I:
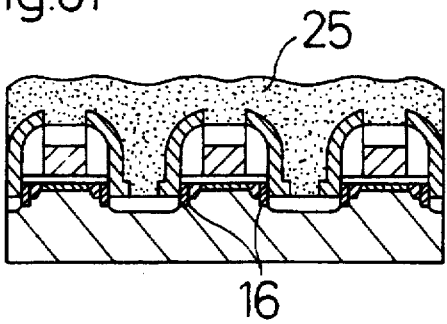
Figure 8J:
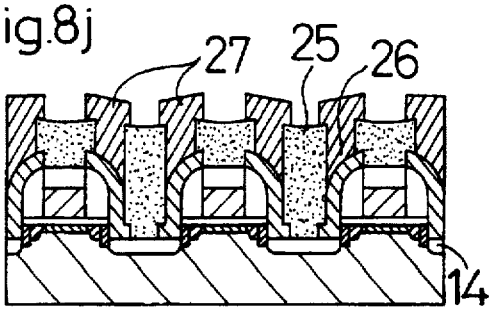

Next, as shown in FIGS. 8i and 8j, the same steps as illustrated in FIGS. 2i and 2j in the first embodiment are performed, thereby forming the interlayer insulating film 25, the heavily doped source/drain regions 16, the contact portions 26, and the Al wiring 27.

In the semiconductor device formed by the manufacturing process of the present embodiment, the individual MOS transistors are separated by the insulating films 14 for capacitance reduction, not by the LOCOS films, in a cross section perpendicular to the gate electrodes 11. In other words, the insulating films 14 for capacitance reduction function as isolations. Consequently, in the semiconductor device of the present embodiment, the interval between each adjacent two MOS transistors can be reduced, so that the integration of the MOS transistors can be significantly reduced, compared with that in the semiconductor device of the above respective embodiments.

Although the LOCOS films have been formed in stripes so that the insulating films for capacitance reduction are formed in the direction perpendicular to the LOCOS films in accordance with the manufacturing process of the semiconductor device of the present embodiment, the present invention is not limited to the embodiment. It is also possible to form the insulating films for capacitance reduction in two directions perpendicular to each other so that the silicon substrate is divided into matrix by the insulating films for capacitance reduction.

The insulating films for capacitance reduction are not necessarily formed on the surfaces of the concave portions. It is also possible to form, without forming the concave portions, the insulating films for capacitance reduction in the near-surface region of the silicon substrate between the sidewalls belonging to different, adjacent MOS transistors, etch back the sidewall spacers, and form the heavily doped source/drain regions in accordance with the manufacturing process of the above fifth embodiment.

It will be easily appreciated that, even in the case where the insulating films for capacitance reduction function as isolations described in the above seventh embodiment, the semiconductor device can be formed by the same manufacturing process as used in the above second to sixth embodiments.

Figure 9A:
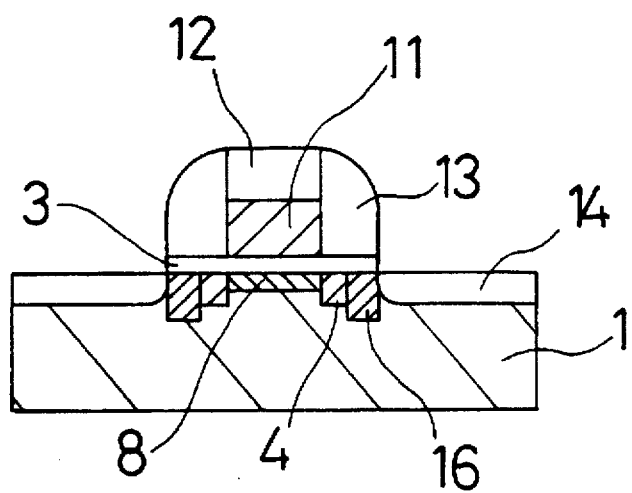
FIGS. 9a to 9d are vertical sectional views showing the transition of the structure of a semiconductor device according to an eighth embodiment in the manufacturing process thereof.
Figure 9B:
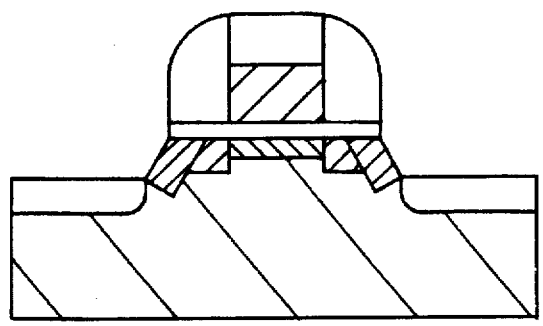
Figure 9C:
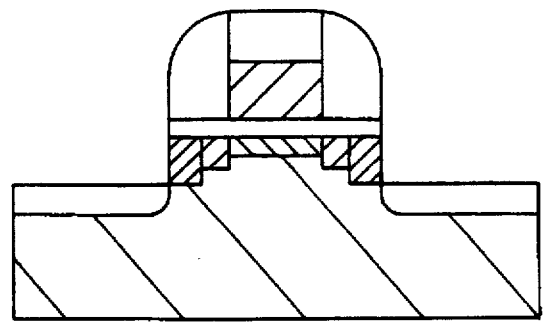
Figure 9D:
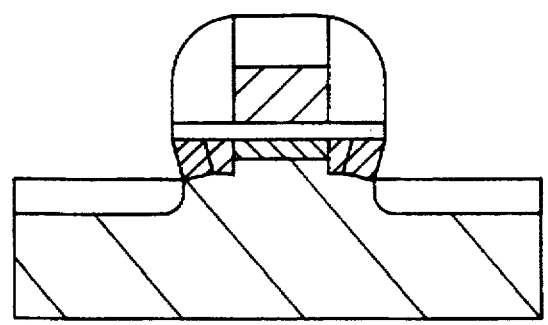
Figure 10:
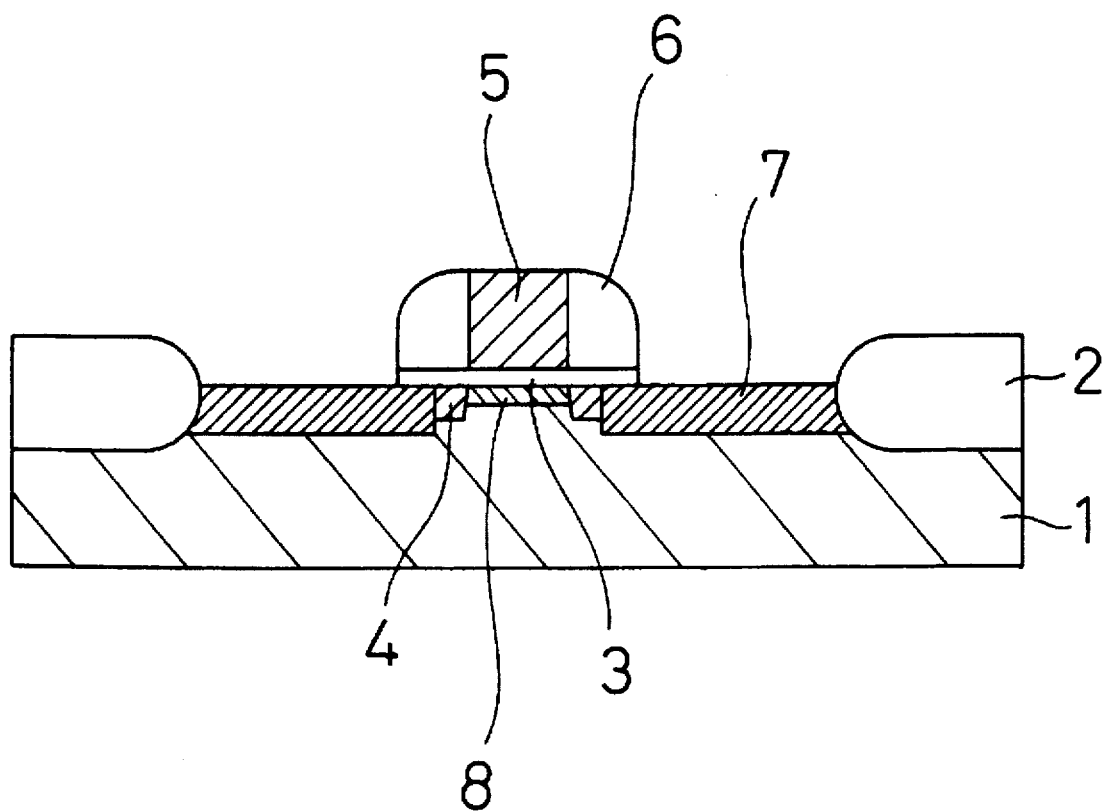
FIG. 10 is a vertical sectional view showing the structure of a conventional semiconductor device.

Although the concave portions are formed so that their sidewalls are substantially vertical to the surface of the silicon substrate in the above individual embodiments, the present invention is not limited to these embodiments. FIGS. 9a to 9d show variations of the cross-sectional configuration of the MISFET according to the present invention: FIG. 9a shows the case in which the concave portions are not formed; FIG. 9b shows the case in which the sidewalls of the concave portions are inwardly tapered; FIG. 9c shows the case in which the sidewalls of the concave portions are substantially vertical to the surface of the silicon substrate; and FIG. 9d shows the case in which the sidewalls of the concave portion are outwardly tapered. In either case, it is possible to interpose the spaces between the insulating films for capacitance reduction and the sidewall spacers, so that the area occupied by the source/drain regions can be reduced.

(Eighth Embodiment)

Next, an eighth embodiment will be described.

Figure 11A:
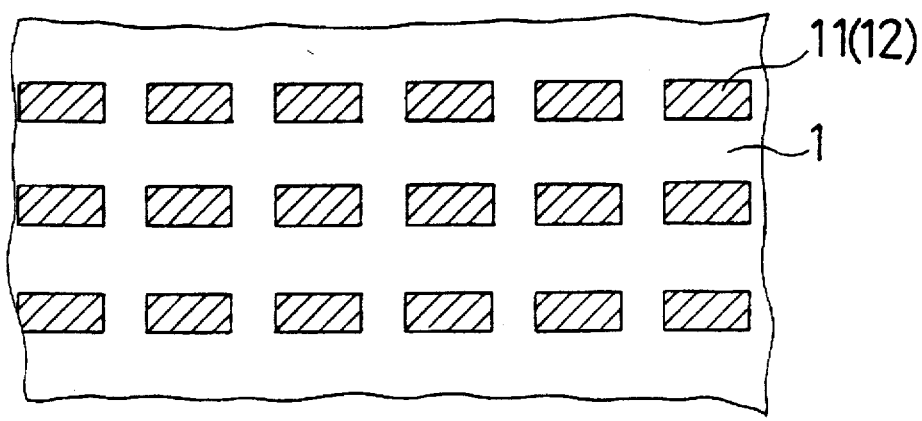
FIGS. 11a to 11c are plan views showing the transition of the structure of a semiconductor device according to the eighth embodiment in the manufacturing process thereof.
Figure 11B:
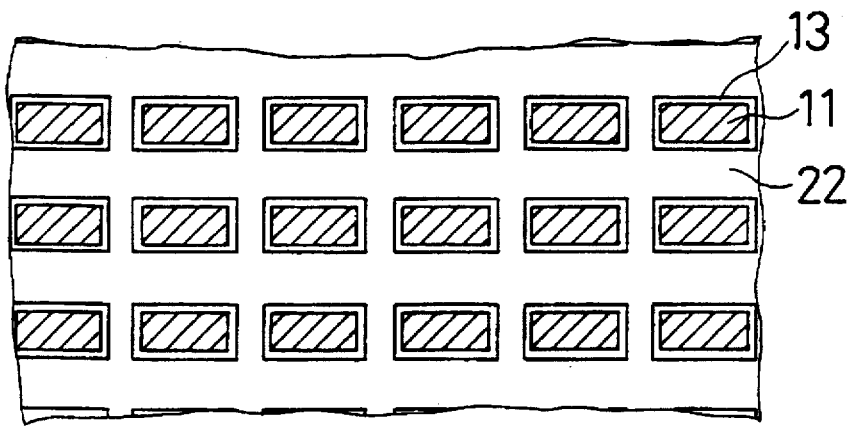
Figure 11C:
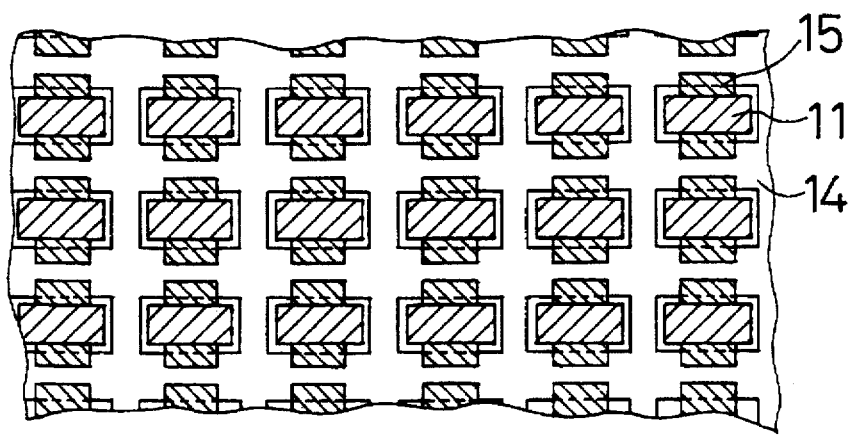

FIGS. 11a to 11c are plan views showing a semiconductor device of the eighth embodiment in the manufacturing process thereof.

First, a plurality of linear gate wirings and the insulating films on gate are provided in stripes. After the lightly doped source/drain regions 4 are formed by introducing arsenic ion (As$^+$) at a low concentration, the gate wirings are patterned to form, on the silicon substrate 1 via the gate oxide film (not shown), the gate electrodes 11 in discrete islands, as shown in FIG. 11a. Wherein, the insulating films 12 on gate are formed on the gate electrodes 11.

Next, as shown in FIG. 11b, after the insulating films are deposited on the entire surface of the substrate, sidewalls 13 are formed by anisotropic etching. Thereafter, the above mentioned concave portions 22 shown in FIG. 8d are formed among sidewalls 13. At this time, all the regions around the gate electrodes 11 and the sidewalls 13 are the concave portions 22. Then, the steps shown in FIGS. 8d-8g in the seventh embodiment are performed. Wherein, when the insulating films 14 for capacitance reduction are formed by oxidizing the bottom of the concave portions 22 before the polysilicon film 15a shown in FIG. 8f is formed, the anti-oxidization film 23 shown in FIG. 8e is formed around the entire circumferences of the gate electrodes 11, then the silicon substrate exposed at the bottom of the concave portions 22 is oxidized. According to the above steps, the insulating films 14 for capacitance reduction are formed which function as isolations around the entire circumferences of the gate electrodes 11.

Next, as shown in FIG. 11c, the withdrawn electrodes 15 are formed on the sidewalls 13, except on both end parts of the gate electrodes 11. At this time, FIG. 8h in the seventh embodiment shows the section across at right angle in longitudinal direction of the gate electrodes 11.

Thereafter, the same steps as illustrated in FIGS. 8i, 8j, and the like in the seventh embodiment are performed.

In the present embodiment, MOSFETs which operate independently from each other are formed in the vicinity of the respective gate electrodes 11. Moreover, the areas of the region 14, which function as isolations, can be significantly reduced.

Wherein, under non LDD structure, implantation of ion impurity is not required for forming the lightly doped source/drain regions. In addition, the heavily doped source/drain regions can be form by the various methods mentioned in the above embodiments.

We claim:

1. A method of manufacturing a semiconductor device in which a plurality of MISFETs, each having a gate electrode, a gate insulating film, and source/drain regions, are disposed in portions of a semiconductor substrate, said method comprising the steps of:

forming individual gate electrodes via gate insulating films on active regions of a semiconductor substrate in discrete rectangular islands that are arranged in a matrix;

after said step of forming individual gate electrodes, forming pairs of sidewall insulating films on each side face of the gate electrodes;

forming source/drain regions separated in a first direction in regions interior to those portions of said semiconductor substrate located 0.2 μm exterior to said sidewall insulating films, and after said step of forming the sidewall insulating films, forming insulating films entirely around each gate electrode for capacitance reduction in the regions located between said source/drain regions of said individual MISFETs so that spaces are interposed between the insulating films for capacitance reduction and said sidewall insulating films and that said insulating films for capacitance reduction function as isolations for the MISFETs in said firs direction.

2. A method of manufacturing a semiconductor device in which a plurality of MISFETs each having a gate electrode, a gate insulating film, and source/drain regions, are disposed in portions of a semiconductor substrate, said method comprising the steps of:

forming said gate electrodes having side faces via gate insulating films on active regions of said semiconductor substrate;

after said step of forming the gate electrodes, forming pairs of sidewall insulating films on the side faces of said gate electrodes;

forming concave portions having sidewalls in those regions of said semiconductor substrate located between said sidewall insulating films of said individual MISFETs, said concave portions having a difference in level at the outer edges of the sidewall insulating films;

forming the source/drain regions spaced in a first direction in the regions interior to those portions of said semiconductor substrate located 0.2 µm exterior to said sidewall insulating films; and after said step of forming the sidewall insulating films, forming insulating films for capacitance reduction in the regions located between said source/drain regions of said individual MISFETs so that spaces are interposed between the insulating films for capacitance reduction and said sidewall insulating films and that said insulating films for capacitance reduction function as isolations for the MISFETs in said first direction, wherein in said step of forming the insulating films for capacitance reduction, an anti-oxidation film having a high etch selectivity with respect to said sidewall insulating films is deposited over the entire surface of the substrate, said anti-oxidation film is anisotropically etched and left at least on the sidewalls of the concave portions, the semiconductor substrate exposed on a lower level of the concave portions is oxidized, and said anti-oxidation film is removed so that the sidewalls of the concave portions correspond to the spaces between said insulating films for capacitance reduction and said sidewall insulating films.

3. A method of manufacturing a semiconductor device according to claim 1, wherein said step of forming the source/drain regions is performed after the step of forming the insulating films for capacitance reduction, in such a manner that a first-conductive type impurity is introduced into the semiconductor substrate through said spaces on the longitudinal sides of the gate electrodes between the insulating films for capacitance reduction and the sidewall insulating films by tilted angle ion implantation.

4. A method of manufacturing a semiconductor device according to claim 1, further comprising the steps of:

in said step of forming the gate electrodes, after the plural gate wirings arranged in stripes are formed, patterning each gate wiring to form said discrete rectangular gate electrodes; and after the strip gate wirings are formed and before the rectangular gate electrodes are patterned, introducing a first-conductive type impurity into the semiconductor substrate at a low concentration, using the gate wirings as a mask.

* * * * *

UNITED STATES PATENT AND TRADEMARK OFFICE
CERTIFICATE OF CORRECTION

PATENT NO. : 5,683,921
DATED : November 4, 1997
INVENTOR(S) : NISHIO et al.

It is certified that error appears in the above-identified patent and that said Letters Patent is hereby corrected as shown below:

Col. 17, line 2: Change "firs" to read --first--

Signed and Sealed this

Fifteenth Day of December, 1998

Attest:

BRUCE LEHMAN

Attesting Officer

Commissioner of Patents and Trademarks